United States Patent
Hues et al.

(10) Patent No.: US 7,176,133 B2
(45) Date of Patent: Feb. 13, 2007

(54) CONTROLLED ELECTROLESS PLATING

(75) Inventors: Steven M. Hues, Round Rock, TX (US); Michael L. Lovejoy, Austin, TX (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 235 days.

(21) Appl. No.: 10/994,720

(22) Filed: Nov. 22, 2004

(65) Prior Publication Data

US 2006/0110911 A1    May 25, 2006

(51) Int. Cl.
*H01L 21/44* (2006.01)
(52) U.S. Cl. .......... 438/678; 438/622; 438/E21.174; 427/443.1
(58) Field of Classification Search ........... 438/678; 427/443.1
See application file for complete search history.

(56) References Cited

U.S. PATENT DOCUMENTS

| | | | |
|---|---|---|---|
| 6,645,567 B2 | 11/2003 | Chebiam et al. | |
| 6,709,561 B1 | 3/2004 | Pavlov et al. | |
| 6,797,312 B2 | 9/2004 | Kong et al. | |
| 6,924,232 B2* | 8/2005 | Mathew et al. | 438/678 |
| 2004/0137161 A1 | 7/2004 | Segawa et al. | |
| 2004/0157441 A1 | 8/2004 | Inoue et al. | |
| 2006/0202342 A1* | 9/2006 | Andreyushchenko et al. | 257/758 |

OTHER PUBLICATIONS

"Quantitative Analysis of Active Metals and Metal Hydrides via Gas Buret"; Aldrich Technichal Bulletin AL-123; Apr. 1996; 3 pgs.
"Electroless Nickel Plating Bath"; Dionex Web Site; 2003; http://www.dionex.com/en/columns_accessories/ion_exchange/flash/fullflash3216.
U.S. Appl. No. 10/650,002, filed Aug. 27, 2003.

* cited by examiner

*Primary Examiner*—Dung A. Le
(74) *Attorney, Agent, or Firm*—Robert L. King; James L. Clingan, Jr.

(57) ABSTRACT

An electroless metal deposition process to make a semiconductor device uses a plating bath solution having a reducing agent. A sample of the bath solution is taken and the pH of the sample is increased. The hydrogen evolved from the sample is measured. The hydrogen evolved is used to determine the concentration of the reducing agent present in the sample. Based on the determined reducing agent concentration, the plating bath solution is modified.

29 Claims, 3 Drawing Sheets

CONTROLLED ELECTROLESS PLATING

CROSS REFERENCE TO RELATED APPLICATION

This application is related to pending U.S. Pat. application Ser. No. 10/650,002 filed by Mathew et al. entitled "Semiconductor Process and Composition for Forming A Barrier Material Overlying Copper", filed Aug. 27, 2003 and now assigned to the assignee hereof.

FIELD OF THE INVENTION

This invention relates generally to semiconductors, and more specifically, to making semiconductor devices having very small dimensions.

BACKGROUND OF THE INVENTION

Semiconductor processing typically involves the deposition of a metal layer. One known technique to deposit metal in semiconductors is via electroless deposition that utilizes bath solutions to form the metal. It is critical that the concentration levels of the bath solution components be maintained within certain acceptable concentration limits. Equipment has been developed to accurately measure the concentration of bath solutions components to generate a bath solution of desired properties. However, as the electroless deposition process occurs, the concentration of various components decreases and byproducts are generated. For some applications, such as electrolytic plating of non-electronic products, additional component materials may be added to replenish depleted components. However, for semiconductor manufacturing involving small dimensions of metal deposition, component composition process limits are much more critical. Therefore, electroless bath solutions typically have a limited amount of useful application and are typically discarded once a certain amount of use or a certain amount of time has occurred. The proper disposal of bath solutions is an expensive and time consuming aspect of semiconductor manufacturing.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
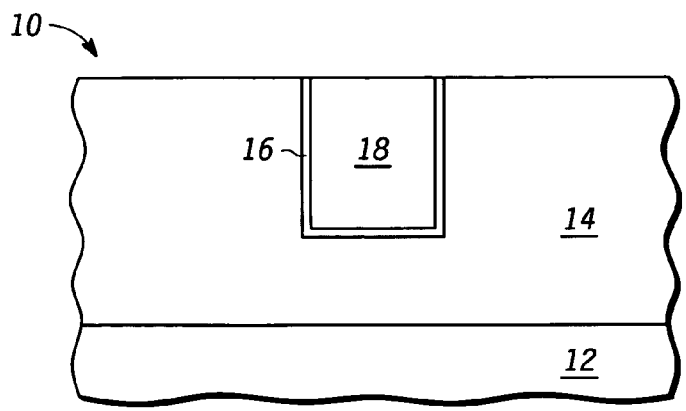
FIG. 1 illustrates in cross-sectional form a semiconductor device having a metal component that has been deposited.

Illustrated in FIG. 1 is a semiconductor device 10 having a metal structure. Semiconductor device 10 has a substrate 12 and an overlying insulating layer 14. The substrate may be of various materials such as silicon or silicon germanium. Other substrate materials may be used. The insulating layer 14 may be formed of any type of dielectric material. Common materials used for insulating layer 14 are some form of an oxide such as silicon dioxide. Etched within the insulating layer 14 is a trench or via formed by conventional photolithography techniques. Along the edges of the trench is formed a thin barrier layer 16. Electrolytic deposition is used to deposit a metal interconnect 18 over and along all exposed surfaces of the thin barrier layer 16 and to completely fill the trench or via. In one form, the thin barrier layer 16 is a nitride layer, but may be any of other materials used as a barrier in semiconductor processing. Typically, the metal interconnect 18 is deposited to overlie the planar upper surface of the insulating layer 14 and chemical mechanical polished (CMP) to a planar upper surface that is coplanar with the upper surface of the insulating layer 14. The metal that is used as metal interconnect 18 may be any of a variety of metals such as cobalt, tungsten, copper, etc. or a combination thereof.

Figure 2:
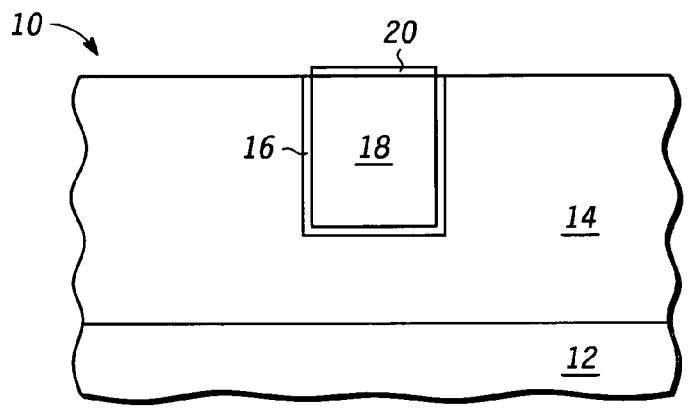
FIG. 2 illustrates in cross-sectional form further processing of the semiconductor device of FIG. 1.

Illustrated in FIG. 2 is further processing of semiconductor device 10. A barrier layer 20 is formed overlying the metal interconnect 18. In one form, the barrier layer 20 is for example a cobalt tungsten boron alloy, CoWB. Semiconductor device 10 is merely representative of a number of metal deposition applications commonly required in semiconductor manufacturing. In the immediate example, further processing above the insulating layer 14 and the thin barrier layer 16 is implemented. Such further processing requires annealing of the semiconductor device 10. The application of heat could cause the metal interconnect 18 to diffuse into overlying materials and into the insulating layer 14 if the barrier layer 16 and barrier layer 20 were not present. The use of electroless deposition of metal therefore is a critical aspect in the manufacture of a semiconductor. It should also be appreciated that other examples of metal deposition by electroless deposition are common. For example, the deposition of metal layers to form conductors such as power and signal conductors is common.

Figure 3:
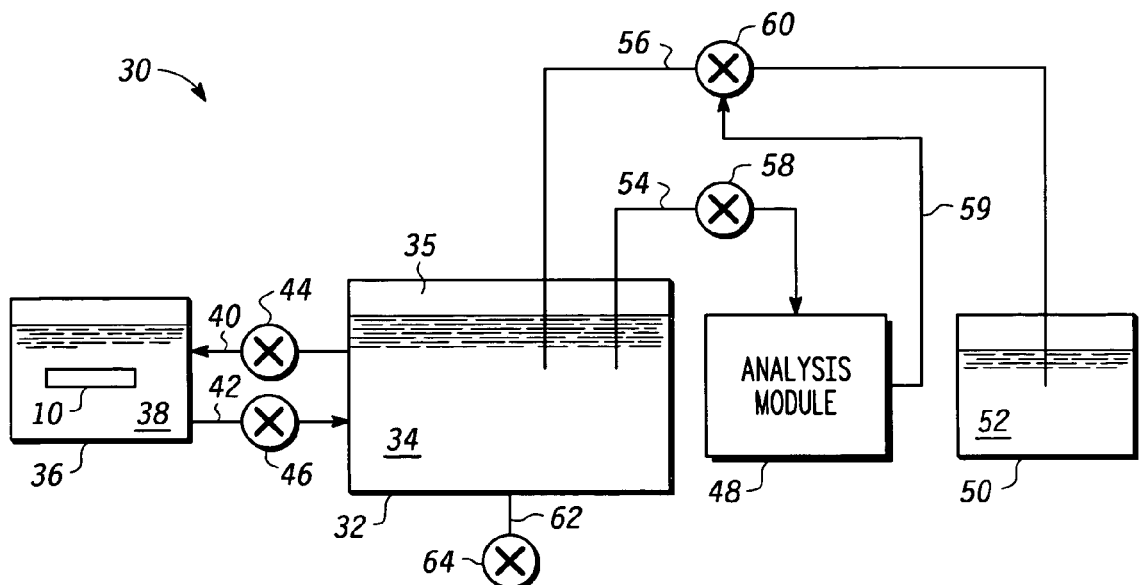
FIG. 3 illustrates in perspective view an electroless metal deposition system in accordance with the present invention.

Illustrated in FIG. 3 is a manufacturing apparatus 30 to manufacture a semiconductor using electroless metal deposition. A reservoir 32 is provided with an electroless solution or bath solution 34. Above the bath solution 34 is an air region 35. A wafer processing chamber 36 is connected to the reservoir 32 via an inlet line 40 and an outlet line 42. Within the wafer processing chamber 36 is a bath solution 38 in which the semiconductor device 10 is immersed. Semiconductor device 10 is typically in the form of a semiconductor wafer containing many individually integrated circuit devices that are subsequently separated and packaged individually. A valve 44 is placed in the inlet line 40 and a valve 46 is placed in the outlet line 42. Valve 44 and valve 46 are controlled either manually or automatically by control signals (not shown) to transfer the solution between reservoir 32 and the wafer processing chamber 36. It should also be understood that pumps (not shown) may be included within inlet line 40 and outlet line 42 for implementing the flow of bath solution 34 and bath solution 38, respectively. In one form, wafer processing chamber 36 is filled and then periodically circulated back into reservoir 32 and then replenished. In yet another form, bath solution 34 and bath solution 38 are continuously circulated between the respective containers. Also connected to the reservoir 32 is an analysis module 48. A sampling line 54 is connected from within the bath solution 34 to the analysis module 48 via a valve 58. A replenishing line 56 is connected to a replenishment module 50. Within the replenishing line 56 is a valve 60. Within the replenishment module 50 is a replenishment solution 52. When needed to adjust bath level, a quantity of the bath solution may be removed from reservoir 32 through a drain line 62. Within the drain line 62 is a valve 64. Drain line 62 is directed as waste to an acceptable waste storage (not shown). An output of the analysis module 48 is a control signal 59 that is connected to a control input of valve 60 for controlling whether valve 60 is open or closed. When valve 60 is open, the replenishment solution 52 is coupled into the bath solution 34. In one form, the replenishment solution 52 is additional reducing agent that is dissolved in liquid form. For example, in one form the replenishment solution 52 is morpholine borane dissolved in water in addition to optional additional components such as a metal, chelating agents, etc.

In operation, a predetermined bath solution 34 is placed within the reservoir 32. Within the bath solution 34 is at least a predetermined amount of cobalt salt ($CoSO_4$ or $CoCl_2$ for example) and a reducing agent. It should be well understood that other metal salts may be used. Additionally, other components may be added to the bath solution 34 for functions such as chelating and pH adjustment. There are numerous acceptable reducing agents that are used in electroless metal deposition. In one form, the reducing agent MPB (morpholine borane) or DMAB (Dimethylaminoborane) may be used. Other reducing agents such as hydrazine, borohydride and hypophosphite may be used. Conventional component concentrations have a large excess concentration of metal as compared with the reducing agent. The percentages of metal and reducing agent may vary within well known ranges and will therefore not be specified herein.

A sample of the bath solution 34 is either continuously fed or periodically fed to the analysis module 48 in response to controlling valve 58. When needed, bath solution 34 may be drained from reservoir 32 through drain line 62 in response to controlling valve 64, in order to maintain a liquid optimum level in reservoir 32. In an alternative form, it should be understood that the analysis performed by analysis module 48 may be implemented separate and remote from the reservoir 32 and the wafer processing chamber 36 without using sampling lines. The analysis module 48 functions to drive the metal reduction reaction in the sample removed from reservoir 34 to completion and thereby consume all available reducing agents. This method allows this process to occur within a matter of minutes allowing real time feedback of the solution chemistry modification. The reduction reaction (driven to completion) generates hydrogen gas in a specific proportion to the original reducing agent concentration.

Figure 4:
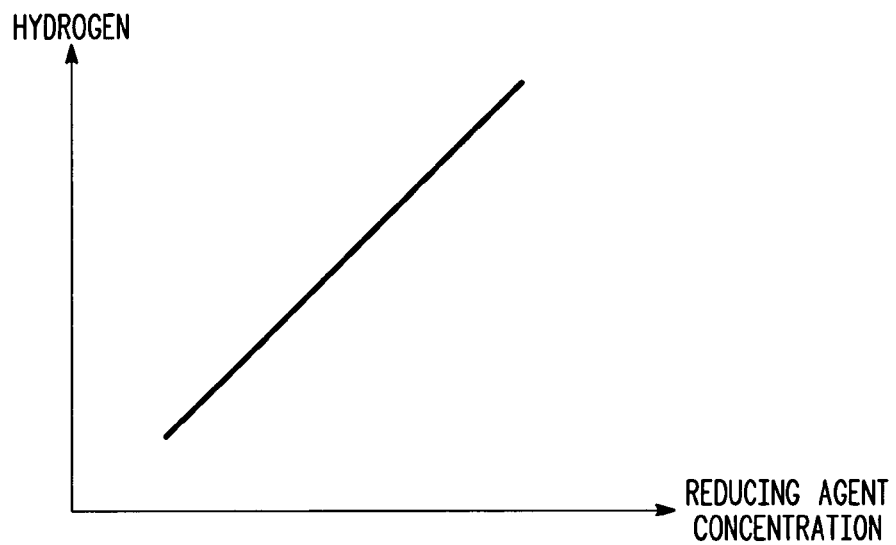
FIG. 4 illustrates in graphical form the relationship between the quantity of evolved hydrogen and reducing agent concentration in a bath solution.

Illustrated in FIG. 4 is a graph illustrating the relationship of hydrogen generated during the reduction reaction in the bath solution 34 sampled from reservoir 32 to the reducing agent concentration. The relationship is substantially linear over the process range of concern. As the reducing agent concentration increases, the hydrogen generated increases. This relationship may be advantageously used to determine the concentration of reducing agent. In the example below, the quantity of hydrogen will be measured in order to determine the concentration of the reducing agent.

The quantity of generated hydrogen gas is either measured as a function of pressure in a constant volume mode or is measured as a function of volume in a constant pressure mode. From this measurement the original concentration of reducing agent is determined and one of three possible actions is implemented in response. The first action is to fully replace the bath solution 34 and bath solution 38 when the reducing agent concentration falls below a critical level eliminating the possibility of reduction reaction byproduct contamination on the plating process. Below this critical level of reducing agent concentration, the metal deposition will be reduced to an unacceptable level. The second possible action is to replenish the level of reducing agent to the normal processing level with optional chemical filtration of accumulated reduction reaction byproducts. In an alternative form, the bath solution 34 and bath solution 38 may be partially replaced with fresh solution in order to replenish the reducing agent concentration and reduce the byproduct contamination below the level in which it affects the quality of the deposited metal film. The third option is to adjust the metal deposition time to compensate for the reduced deposition rate, due to the lowered reducing agent concentration in order to yield the desired metal layer thickness.

Figure 5:
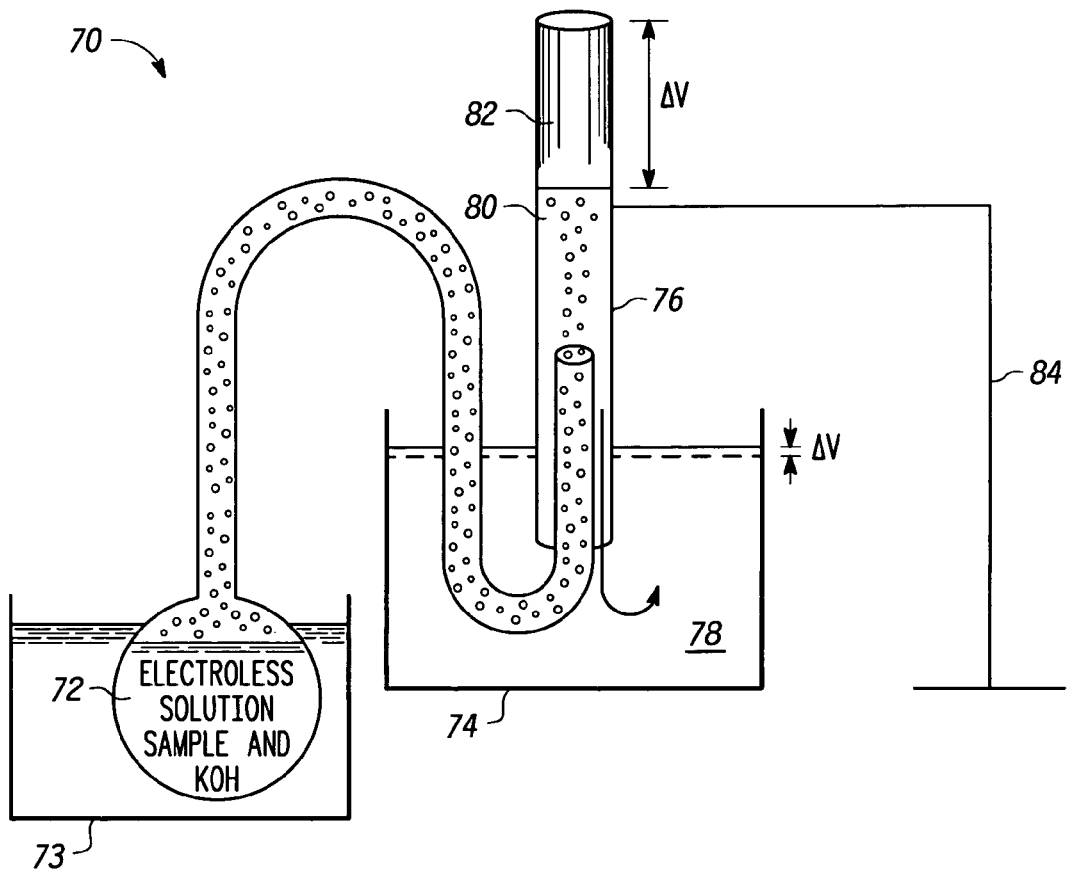
FIG. 5 illustrates in perspective view a first embodiment of a portion of the analysis module of FIG. 3.

Illustrated in FIG. 5 is one form of the evolved hydrogen analysis equipment that may be used to determine the amount of hydrogen generated by the bath solution 34 sample from reservoir 32 when the reduction reaction is forced to completion by base addition (e.g. hydroxide addition in one form), consuming all of the available reducing agent. When a reducing agent of DMAB is used, another technique to force reduction reaction completion is to elevate the temperature of the sampled bath solution. In addition, a combination of pH adjustment and temperature adjustment may be used to force and accelerate the reaction completion. In FIG. 5, a physical principle of using a constant pressure and measuring the volume of hydrogen that is generated is used. An ultrasonic bath 73 is provided with a solution bath sample 72 contained in a vessel. It should be appreciated that other forms of agitation rather than an ultrasonic bath may also be used. The solution bath sample 72 contains the solution sampled from reservoir 32. As noted in FIG. 5, this sample contains, in one form, the basic addition of a hydroxide such as KOH, potassium hydroxide, to create a basic pH of preferably about twelve or greater. The agitation causes the rapid coalescence of generated hydrogen bubbles. The gas hydrogen bubbles are passed through a tube that is placed in the vessel 74 containing water 78 or other liquid capable of forming a gas tight seal with closed-end tube 76. The closed-end tube 76 is originally filled to a known predetermined volume at the start of the analysis with water 80 or other suitable liquid that was contained in vessel 74. The hydrogen gas bubbles accumulate in the upper end of the closed-end tube 76 to form a region 82 within closed-end tube 76 made up of the evolved hydrogen from the reaction in the solution bath 72. The accumulation of hydrogen gas bubbles forces a displacement of water in the vessel 74 and the collected volume is measured at the end of the analysis by taking the difference between the initial and final liquid levels in closed-end tube 76. This difference is illustrated in FIG. 5 as delta V, volume. The amount of changed volume within the closed end tube 76 is the same as the amount of resulting changed volume within vessel 74. The reducing agent concentration of the bath solution 34 is then determined by referencing this changed volume, delta V, to FIG. 4.

Figure 6:
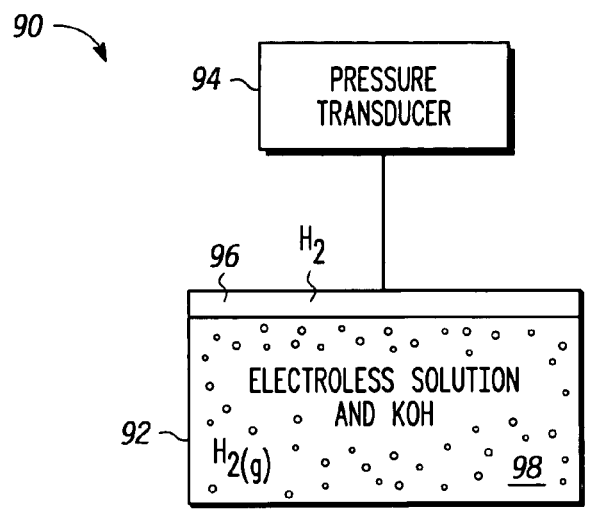
FIG. 6 illustrates in perspective view a second embodiment of a portion of the analysis module of FIG. 3.

Illustrated in FIG. 6 is yet another form of the hydrogen analysis equipment that may be used to determine the amount of hydrogen generated by the bath solution sample from reservoir 32 when the reduction reaction is forced to completion by base addition (e.g. hydroxide addition in one form), consuming all of the available reducing agent. In FIG. 6, a physical principle of using a constant volume and measuring the pressure of hydrogen that is generated is used. In the illustrated example, a vessel 92 contains a sample of the bath solution 34. The vessel 92 is filled in such a manner such as to produce a minimal amount of a head space 96. When the reduction reaction is forced to completion, hydrogen gas is evolved and pressurizes the fixed volume of head space 96. The pressure generated within the head space 96 is measured by a pressure transducer 94 and is directly related to the quantity of hydrogen generated and the original reducing agent concentration may then be determined using a calibration chart similar to that illustrated in FIG. 4.

Figure 7:
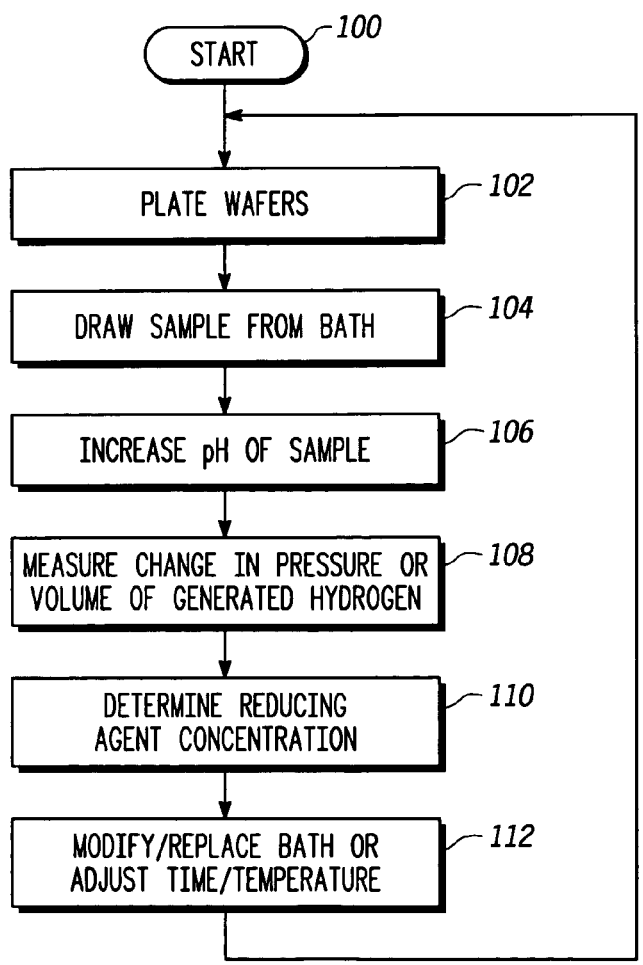
FIG. 7 illustrates in flowchart form a process control methodology for electroless metal deposition in accordance with the present invention.

Illustrated in FIG. 7 is a flowchart of one form of electroless metal deposition in a semiconductor process according to the present invention. A start step 100 initiates the processing. In a step 102 semiconductor wafers are placed in a bath solution to be plated with a predetermined metal by an electroless metal deposition. In a step 104 a sample of the bath solution is drawn from the bath or vessel containing the bath solution. In a step 106, the pH of the sample that was drawn is increased to force the reduction reaction rapidly to completion, generating hydrogen gas from the solution sampled from the bath. The sample is made more basic by the addition of a hydroxide. In other forms, reduction reaction is accelerated by raising the temperature of the sample or by both the addition of a hydroxide and raising the temperature.

In a step 108 a change in pressure or volume is measured by using the generated hydrogen and a conventional principle of physics. For example, the apparatus of either FIG. 5 or FIG. 6 may be used to measure respectively a change in volume and pressure. In a step 110 the measured change in pressure or volume is used to determine a correlated concentration of the reducing agent present in the sample of the bath solution. In one form, this correlation is made using a graphical relationship such as the graph of FIG. 4. How this correlation is made may vary. For example, the correlation may be done manually but preferably is performed automatically by software. The correlated values may be stored in a memory (not shown) in order to automate step 110. In a step 112 various modifications to the main bath solution are made based on the result of step 110. For example, in step 112 if the value determined in step 110 is below a predetermined critical value the bath solution of the electroless deposition solution may be partially or fully replaced. Modification of the bath solution may be made by adding more reducing agent if required. If the concentration of reducing agent component indicated in step 110 is within an acceptable range, no action may be needed. Additional actions within step 110 include the adjustment of deposition time. If the reducing agent component is lower than earlier in time, rather than change the bath solution component it can be recognized that the deposition rate is slower and therefore additional deposition time may be allowed to complete metal formation. Additionally, if the reducing agent component is lower than earlier in time, rather than change the bath solution component the bath solution chamber temperature may be elevated. A rise in temperature in the vessel containing the bath solution may stimulate the electroless reaction and improve the deposition rate. A combination of adjusting both the time for deposition and the vessel temperature may be utilized. After an appropriate action is taken to modify or replace the bath solution, the process returns to the beginning of step 102 and the method repeats to plate new wafers.

By now it should be appreciated that there has been provided a method for metal plating. A sample of plating solution has the pH thereof adjusted to accelerate a rate of reaction. Gasometric analysis of evolved or liberated hydrogen is performed to determine a measurement of the quantity of hydrogen evolved from the sample. An amount of reducing agent in the sample is determined by a predetermined correlation with the evolved quantity of hydrogen. In response to knowing the concentration of reducing agent in the sample, various actions may be taken to the electroless bath solution. The analysis module 48 may be implemented fully automated with software or may be performed by a series of steps by an operator of the plating apparatus. Additionally, the calculations and measurements by be automated fully or be performed by a mix of computer automation and manual steps. The method disclosed herein functions to minimize the premature disposal of plating solution, thereby saving significant environmental disposal or recycling expense associated with the chemicals involved in a plating process.

There is provided herein a method for making a semiconductor device. A device structure is provided having an active circuit region and a metal interconnect that is over and insulated from the active circuit region. The metal interconnect has a top surface that is exposed. A plating bath having a reducing agent is provided. A sample of the plating bath is obtained. The pH of the sample is increased. A quantity of hydrogen evolved from the sample is measured. The quantity of hydrogen measured is used to determine a concentration of the reducing agent present in the sample. The top surface of the metal interconnect is plated by immersing the device structure in the plating bath if the concentration of the reducing agent is within a predetermined range. In one form increasing the pH is performed by adding a hydroxide to the sample. In another form the interconnect is at least copper and the plating includes forming a layer of an alloy of cobalt on the top surface. In another form the reducing agent is morpholine borane. In another form the reducing agent is characterized as producing hydrogen gas during a reduction reaction. In another form the reducing agent is characterized as having a reducing rate that occurs more rapidly with an increase in pH. In another form the step of measuring the quantity of evolved hydrogen includes providing an expandable space at a substantially constant pressure and directing hydrogen evolved from the sample into the expandable space. A change in the expandable space is measured and the quantity of hydrogen is determined based on the change in expandable space. In another form the expandable space is bounded by a container and a liquid at atmospheric pressure. In another form the step of measuring the quantity of hydrogen includes providing a space of constant volume and directing hydrogen evolved from the sample into the space of constant volume. A change in pressure in the space of constant volume is measured. The quantity of hydrogen is determined based on the change in pressure in the space of constant volume. In one form the space of constant volume is bounded by a container and the sample. In another form turbulence is created in the sample. In one form turbulence is created by sonicating. In another form the plating bath is replaced if the concentration of the reducing agent is not within the predetermined range. In another form a quantity of reducing agent is added to the plating bath to obtain a modified plating bath if the concentration of the reducing agent is below a predetermined level. In another form the bath is partially replaced with fresh bath solution to both increase the reducing agent concentration and reduce the level of reaction byproduct contamination. In another form the top surface of the metal interconnect is plated by immersing the device structure in the modified plating bath. In yet another form plating the top surface is performed for a period of time based on the concentration of the reducing agent.

In yet another form there is provided a device to be plated. A plating bath having a reducing agent is provided. A sample of the plating bath is obtained. The pH of the sample is increased. A quantity of hydrogen evolved from the sample is measured. The quantity of hydrogen measured is used to determine a concentration of the reducing agent present in the sample. The device is plated by immersing the device in the plating bath if the concentration of the reducing agent is within a predetermined range. In one form the pH is increased by adding potassium hydroxide to the sample. In another form the reducing agent is one of hypophosphite, morpholine borane, dimethylamineborine, borohydride or hydrazine. In another form the quantity of hydrogen is measured by providing an expandable space at a constant pressure. Hydrogen evolved from the sample is directed into the expandable space. A change in the expandable space is measured. The quantity of hydrogen is measured based on the change in expandable space. In yet another form the quantity of hydrogen is measured by providing a space of constant volume. Hydrogen evolved from the sample is directed into the space of constant volume. A change in pressure in the space of constant volume is measured. The quantity of hydrogen is measured based on the change in pressure in the space of constant volume. In one form the sample is sonicated. In another form the plating bath is replaced if the concentration of the reducing agent is not within the predetermined range. In another form reducing agent is added to the plating bath to obtain a modified plating bath if the concentration of the reducing agent is below a predetermined level. The device is plated by immersing the device structure in the modified plating bath. In another form plating the device is performed for a period of time based on the concentration of the reducing agent.

In yet another form there is provided an electroless plating apparatus. A plating container includes a plating bath having a reducing agent. An analysis module is provided for determining a concentration of the reducing agent of a sample of the plating bath by increasing the pH of the sample and measuring a quantity of hydrogen evolved from the sample. In one form the analysis module sonicates the sample. In another form the analysis module adds a hydroxide to increase the pH of the sample. In yet another form the analysis module measures the quantity of hydrogen evolved from the sample as an increase in volume of an expandable space that receives the hydrogen. In another form the analysis module measures the quantity of hydrogen evolved from the sample as an increase in pressure in a space of fixed volume that receives the hydrogen that is evolved from the sample. In one form the reducing agent is morpholine borane. In another form a second container of reducing agent is coupled to the analysis module and the plating container. The second container supplies reducing agent to the plating bath to increase the concentration of reducing agent in the plating bath as indicated as needed by the analysis module.

In yet another form there is provided a method of making a semiconductor device. A device structure having an active circuit region and a metal interconnect that is over and insulated from the active circuit region is provided. The metal interconnect has a top surface that is exposed. A plating bath is provided having one of morpholine borane or dimethylamineborane as a reducing agent. A sample of the plating bath is obtained. Potassium hydroxide is introduced into the sample to assist in driving a reduction reaction, involving the reducing agent, to completion. A quantity of hydrogen evolved from the reduction reaction is measured to determine a concentration of the reducing agent present in the sample. The top surface of the metal interconnect is plated by immersing the device structure in the plating bath if the concentration of the reducing agent is determined to be within a predetermined range.

In the foregoing specification, the invention has been described with reference to specific embodiments. However, one of ordinary skill in the art appreciates that various modifications and changes can be made without departing from the scope of the present invention as set forth in the claims below. For example, while the plating of a semiconductor device is disclosed herein, it should be apparent that items other than a semiconductor device may be plated. Various metals may be used in connection with the disclosed deposition process. Various plating solutions having differing chemical compositions may be used, such as various reducing agents.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method of making a semiconductor device, comprising:

providing a device structure having an active circuit region and a copper interconnect that is over and insulated from the active circuit region, wherein the copper interconnect has a top surface that is exposed;

providing a plating bath having a reducing agent;

obtaining a sample of the plating bath;

increasing pH of the sample;

measuring a quantity of hydrogen evolved from the sample;

using the quantity of hydrogen measured in the step of measuring to determine a concentration of the reducing agent present in the sample; and plating the top surface of the copper interconnect to form a layer of an alloy of cobalt on the top surface by immersing the device structure in the plating bath if the concentration of the reducing agent is within a predetermined range.

2. The method of claim 1, wherein the step of increasing the pH comprises adding a hydroxide to the sample.

3. The method of claim 1, wherein the reducing agent comprises morpholine borane.

4. The method of claim 1, wherein the reducing agent is characterized as producing hydrogen gas during a reduction reaction.

5. The method of claim 4, wherein the reducing agent is characterized as having a reducing rate that occurs more rapidly with an increase in pH.

6. The method of claim 1, wherein the step of measuring the quantity of hydrogen comprises:
providing an expandable space at a substantially constant pressure;
directing hydrogen evolved from the sample into the expandable space;
measuring a change in the expandable space; and
determining the quantity of hydrogen based on the change in expandable space.

7. The method of claim 6, wherein the expandable space is bounded by a container and a liquid at atmospheric pressure.

8. The method of claim 1, wherein measuring the quantity of hydrogen, comprises:
providing a space of constant volume;
directing hydrogen evolved from the sample into the space of constant volume;
measuring a change in pressure in the space of constant volume; and
determining the quantity of hydrogen based on the change in pressure in the space of constant volume.

9. The method of claim 8, wherein the space of constant volume is bounded by a container and the sample.

10. The method of claim 1 further comprising creating turbulence in the sample.

11. The method of claim 10 wherein creating turbulence comprises sonicating the sample.

12. The method of claim 1, further comprising:
replacing part or all of the plating bath if the concentration of the reducing agent is not within the predetermined range.

13. The method of claim 1, further comprising:
adding a quantity of reducing agent to the plating bath to obtain a modified plating bath if the concentration of the reducing agent is below a predetermined level; and
plating the top surface of the metal interconnect by immersing the device structure in the modified plating bath.

14. The method of claim 1, wherein the step of plating the top surface is performed for a period of time based on the concentration of the reducing agent.

15. A method of making a semiconductor device, comprising:
providing a device structure having an active circuit region and a metal interconnect that is over and insulated from the active circuit region, wherein the metal interconnect has a top surface that is exposed;
providing a plating bath having one of morpholine borane or dimethylamineborane as a reducing agent;
obtaining a sample of the plating bath;
introducing potassium hydroxide into the sample to assist in driving a reduction reaction, involving the reducing agent, to completion;
measuring a quantity of hydrogen evolved from the reduction reaction to determine a concentration of the reducing agent present in the sample; and
plating the top surface of the metal interconnect by immersing the device structure in the plating bath if the concentration of the reducing agent is within a predetermined range.

16. The method of claim 15, wherein the step of measuring the hydrogen comprises:
providing an expandable space at a constant pressure;
directing the hydrogen evolved from the sample into the expandable space; and
measuring a change in the expandable space to determine the concentration of the reducing agent.

17. The method of claim 15, wherein the step of measuring the quantity of hydrogen, comprises:
providing a space of constant volume;
directing hydrogen evolved from the sample into the space of constant volume; and
measuring a change in pressure in the space of constant volume to determine the concentration of the reducing agent.

18. The method of claim 15 further comprising sonicating the sample.

19. The method of claim 15, further comprising:
replacing the plating bath if the concentration of the reducing agent is not within the predetermined range.

20. The method of claim 15, further comprising:
adding reducing agent to the plating bath to obtain a modified plating bath if the concentration of the reducing agent is below the predetermined range; and
plating the semiconductor device by immersing the device structure in the modified plating bath.

21. The method of claim 15, wherein the step of plating the semiconductor device is performed for a period of time based on the concentration of the reducing agent.

22. A method of making a semiconductor device, comprising:
providing a device structure having an exposed surface of metal to be plated;
providing a plating bath having a reducing agent;
obtaining a sample of the plating bath;
increasing a pH of the sample;
measuring a quantity of hydrogen evolved from the sample;
using the quantity of hydrogen measured in the step of measuring to determine a concentration of the reducing agent present in the sample;
adding reducing agent to the plating bath to obtain a modified plating bath if the concentration of the reducing agent is below a predetermined level; and
plating the semiconductor device by immersing the device structure in the plating bath or modified plating bath if the concentration of the reducing agent is within a predetermined range.

23. The method of claim 22, wherein the step of increasing the pH comprises adding potassium hydroxide to the sample.

24. The method of claim 22, wherein the reducing agent comprises one of hypophosphite, morpholine borane, dimethylamineborine, borohydride or hydrazine.

25. The method of claim 22, wherein the step of measuring the quantity of hydrogen comprises:
providing an expandable space at a constant pressure;
directing hydrogen evolved from the sample into the expandable space;
measuring a change in the expandable space; and determining the quantity of hydrogen based on the change in expandable space.

26. The method of claim 22, wherein the step of measuring the quantity of hydrogen, comprises:
   providing a space of constant volume;
   directing hydrogen evolved from the sample into the space of constant volume;
   measuring a change in pressure in the space of constant volume; and
   determining the quantity of hydrogen based on the change in pressure in the space of constant volume.

27. The method of claim 22 further comprising sonicating the sample.

28. The method of claim 22, further comprising:
   replacing all or part of the plating bath if the concentration of the reducing agent is not within the predetermined range.

29. The method of claim 22, wherein the step of plating the device is performed for a period of time based on the concentration of the reducing agent.

* * * * *